(12) United States Patent
Liu et al.

(10) Patent No.: US 10,371,997 B2
(45) Date of Patent: *Aug. 6, 2019

(54) ARRAY SUBSTRATE, METHOD OF MANUFACTURING THE SAME, AND DISPLAY DEVICE

(71) Applicants: BOE Technology Group Co., Ltd., Beijing (CN); Beijing BOE Display Technology Co., Ltd., Beijing (CN)

(72) Inventors: Xiaowei Liu, Beijing (CN); Xi Chen, Beijing (CN); Zhenfei Cai, Beijing (CN); Yao Liu, Beijing (CN); Liangliang Li, Beijing (CN); Zongjie Guo, Beijing (CN)

(73) Assignees: BOE TECHNOLOGY GROUP CO., LTD, Beijing (CN); BEIJING BOE DISPLAY TECHNOLOGY CO., LTD, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/726,995

(22) Filed: Oct. 6, 2017

(65) Prior Publication Data

US 2018/0031896 A1   Feb. 1, 2018

Related U.S. Application Data

(62) Division of application No. 14/314,433, filed on Jun. 25, 2014, now Pat. No. 9,817,287.

(30) Foreign Application Priority Data

Apr. 30, 2014   (CN) .......................... 2014 1 0183395

(51) Int. Cl.
*G02F 1/1345*   (2006.01)
*H01L 27/12*    (2006.01)
*H01L 21/768*   (2006.01)

(52) U.S. Cl.
CPC ........ *G02F 1/13458* (2013.01); *H01L 21/768* (2013.01); *H01L 27/1248* (2013.01);
(Continued)

(58) Field of Classification Search
CPC ....... G02F 1/13458; G02F 2001/13456; H01L 27/1259; H01L 27/1248; H01L 21/768; H01L 27/124

See application file for complete search history.

(56) References Cited

U.S. PATENT DOCUMENTS 5,614,730 A   3/1997   Nakazawa et al.
9,817,287 B2 * 11/2017   Liu ..................... H01L 27/1259
(Continued)

FOREIGN PATENT DOCUMENTS

CN   1615452 A   5/2005

OTHER PUBLICATIONS

First Office Action, including Search Report, for Chinese Patent Application No. 201410183395.3, dated Mar. 3, 2016, 12 pages.
(Continued)

*Primary Examiner* — Steven H Loke
*Assistant Examiner* — Juanita Rhodes
(74) *Attorney, Agent, or Firm* — Westman, Champlin & Koehler, P.A.

(57) ABSTRACT

The present disclosure relates to an array substrate, a method of manufacturing the same and a display device. The array substrate comprises a gate line PAD region and a data line PAD region. In the gate line PAD region of the array substrate, gate-line wirings, which are parallel to the gate lines and are electrically insulated from the gate lines, are provided between adjacent gate lines. In the data line PAD region of the array substrate, data-line wirings, which are parallel to the data lines and are electrically insulated from the data lines, are provided between adjacent data lines.
(Continued)

Both of the gate-line wirings and the data-line wirings are conductive wiring segments. By forming the gate-line wirings and the data-line wirings in the PAD region, the ability of resisting scratch of the product can be improved while not deteriorating performance of display of the product.

15 Claims, 2 Drawing Sheets

(52) U.S. Cl.
CPC .................... *H01L 27/1259* (2013.01); *G02F 2001/13456* (2013.01); *H01L 27/124* (2013.01)

(56) References Cited

U.S. PATENT DOCUMENTS

| | | | |
|---|---|---|---|
| 2002/0071086 A1 | 6/2002 | Kim et al. | |
| 2004/0239837 A1 | 12/2004 | Hong et al. | |
| 2005/0056833 A1 | 3/2005 | Kim | |
| 2005/0173732 A1 | 8/2005 | Yu et al. | |
| 2008/0180627 A1* | 7/2008 | Yasuda | G02F 1/13452 349/152 |
| 2010/0002180 A1* | 1/2010 | Kim | G02F 1/13452 349/143 |
| 2010/0301345 A1 | 12/2010 | Lin et al. | |
| 2011/0063538 A1* | 3/2011 | Xie | G02F 1/134309 349/43 |
| 2011/0285944 A1* | 11/2011 | Park | G02F 1/1345 349/110 |
| 2013/0087794 A1* | 4/2013 | Kwack | H01L 27/1288 257/59 |

OTHER PUBLICATIONS

USPTO-issued prosecution history from U.S. Appl. No. 14/314,433, filed Jun. 25, 2014, including: Applicant Initiated Interview Summary (PTOL-413) dated Oct. 6, 2017, 3 pages; Notice of Allowance and Fees Due (PTOL-85) dated Jul. 18, 2017, 14 pages; Advisory Action (PTOL-303) dated Jun. 13, 2017, 5 pages; Final Rejection dated Mar. 31, 2017, 24 pages; Non-Final Rejection dated Dec. 29, 2016, 23 pages; Non-Final Rejection dated Jul. 15, 2016, 22 pages; Advisory Action (PTOL-303) dated May 19, 2016, 6 pages; Final Rejection dated Mar. 22, 2016, 25 pages; and Non-Final Rejection dated Nov. 24, 2015, 26 pages; 148 pages.

* cited by examiner

ARRAY SUBSTRATE, METHOD OF MANUFACTURING THE SAME, AND DISPLAY DEVICE

CROSS-REFERENCE TO RELATED APPLICATION

This application is a divisional of U.S. application Ser. No. 14/314,433, filed on Jun. 25, 2014, which claims the benefit of Chinese Patent Application No. 201410183395.3 filed on Apr. 30, 2014 in the State Intellectual Property Office of China, the disclosures of which are incorporated herein by reference.

BACKGROUND OF THE INVENTION

Field of the Invention

Embodiments of the present invention relates to the technical field of display, and more particular, to an array substrate, a method of manufacturing the same and a display device.

Description of the Related Art

During a cutting process after an array substrate and a color filter substrate are assembled, as shown in FIGS. 1 and 2, in a PAD region on the array substrate, gate lines 1 and data lines 1' are formed and then an insulating layer 2 is formed onto the gate lines 1 and data lines 1'. The PAD region is a pressing connection region in which signal lines, such as gate lines and data lines, are connected with lead wires of external drive circuit board by pressing, including a gate line PAD region, a data line PAD region and the like. The PAD region is located at one side or any two adjacent sides of four sides of the array substrate. Since it is inevitable that a surface of the array substrate will directly contact with cutting debris, and it is necessary to cut a screen with a smaller size after being transported to a client, a risk of metal lines in the PAD region of the screen being scratched is high and the scratched metal lines cannot be restored, thereby adversely influencing a yield rate for a product. Furthermore, the data signal line has a certain thickness and bigger bulges are formed on the surface of the array substrate. A step caused due to such bulges will readily cause scratch which cannot be restored. It is found by analysis and experiment that the step caused by the data lines is closely related with the scratch. The higher the step is, the higher the risk of being scratched is. In reverse, the lower the step is, the lower the risk of being scratched is. Furthermore, such scratch cannot be restored and thus directly causes defective products, thereby severely influencing a yield rate for a product.

At present, a solution for the above problem is mainly to reduce a thickness of a metal film so as to reduce the step. Reduction of thickness of the metal film, however, will cause increase in resistance and capacitance delay. Thus, defects, such as residual image, will be worsened and performance of product will be severely influenced. Therefore, there is a conflict between ensuring display performance of a product and improving an ability of resisting scratch.

SUMMARY OF THE INVENTION

In order to overcome the above mentioned and other technical problems in the prior art, the present invention provides an array substrate, a method of manufacturing the array substrate and a display device including the array substrate. With design of the present invention, the ability of resisting scratch of the array substrate can be improved while ensuring performance of display of the display device.

According to embodiments of an aspect of the present invention, it provides an array substrate comprising a gate line PAD region and a data line PAD region, wherein in the gate line PAD region of the array substrate, gate-line wirings, which are parallel to the gate lines and are electrically insulated from the gate lines, are provided between adjacent gate lines, and wherein in the data line PAD region of the array substrate, data-line wirings, which are parallel to the data lines and are electrically insulated from the data lines, are provided between adjacent data lines. Both of the gate-line wirings and the data-line wirings are conductive wiring segments.

According to embodiments of another aspect of the present invention, it provides a method of manufacturing the array substrate, comprising the steps of: in the gate line PAD region of the array substrate, providing gate-line wirings between adjacent gate lines, wherein the gate-line wirings are parallel to the gate lines and are electrically insulated from the gate lines; in the data line PAD region of the array substrate, providing data-line wirings between adjacent data lines, wherein the data-line wirings are parallel to the data lines and are electrically insulated from the data lines. Both of the gate-line wirings and the data-line wirings are conductive wiring segments.

According to embodiments of a further aspect of the present invention, it provides a display device including the above array substrate.

REFERENCE NUMBER LIST

Figure 1:
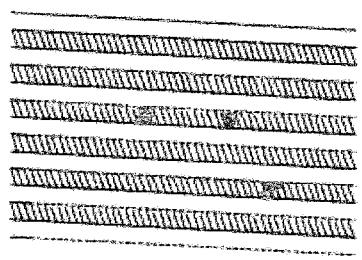
FIG. 1 is a schematic view showing scratch of metal wirings in the data line PAD region or in the gate line PAD region in the prior art.
Figure 2:
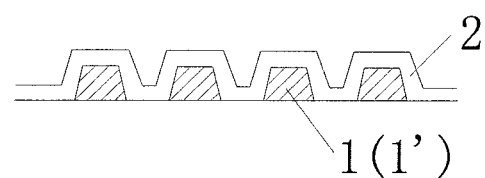
FIG. 2 is a schematic view, in cross-section, showing a structure of the data line PAD region or the gate line PAD region in the prior art.

1: gate line; 1': data line; 2: insulating layer; 3: ITO wiring; 4: first ITO wiring segment; 5: second ITO wiring segment; 6: passivation layer; 7: gate-line wiring; 8: data-line wiring.

DETAILED DESCRIPTION OF EMBODIMENTS

Next, embodiments of the present invention will be further described in detail, in combination with the drawings and specific embodiments. It should be noted that respective embodiments are only used for illustrating the present invention and should not be used for limiting the scope of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Further, it should be noted that "a first . . . ", "a second . . . ", "the first . . . " and "the second . . . " used herein are only used for marking elements so as to facilitate description of the present invention and should not be explained as indicating any time sequence or any structural arrangement difference. Accordingly, as an alternative, the elements indicated by "a first . . . "/"the first . . . " and "a second . . . "/"the second . . . " herein may be indicated by "a second . . . "/"the second . . . " and "a first . . . "/"the first . . . ", respectively, which will not change the technical scheme itself and will fall into the scope of the present invention.

In order to improve the ability of resisting scratch of a display screen during cutting and restore scratched portions of the display screen so as to ensure quality of the display screen, the present invention provides an improved array substrate. Specifically, in the gate line PAD region of the array substrate, gate-line wirings, which are parallel to the gate lines and are electrically insulated from the gate lines, are provided between adjacent gate lines, and wherein in the data line PAD region of the array substrate, data-line wirings, which are parallel to the data lines and are electrically insulated from the data lines, are provided between adjacent data lines. Both of the gate-line wirings and the data-line wirings are conductive wiring segments. With the above array substrate in which the gate-line wirings and the data-line wirings are formed in the PAD region, a step can be reduced, so that the ability of resisting scratch at the step can be improved. Moreover, even if the metal lines are scratched, the wirings parallel to the metal lines can be used as restoring lines and the scratched lines in the PAD region can be restored by perforation and interconnection achieved by deposition. In this way, the ability of resisting scratch of the product can be improved while not deteriorating performance of display of the product.

The so-called PAD region is a pressing connection region in which signal lines, such as gate lines and data lines, are connected with lead wires of an external drive circuit board by pressing, including a gate line PAD region, a data line PAD region and the like. The PAD region is located at one side or any two adjacent sides of four sides of the array substrate. In order to electrically connect the lead wire with the signal lines, no insulating layer covers the signal lines in the PAD region. Generally, connection holes formed by etching are provided above the signal lines, and thus the signal lines are exposed or are connected with conductive elements.

There are a variety of liquid crystal display modes, in which Twist Nematic (TN) mode and Advanced Super Dimension Switch (ADS) mode are often used. The TN mode indicates Twist Nematic liquid crystal. Specifically, in the TN mode, two glass substrates coated with transparent conductive layers sandwich a layer of positive dielectric anisotropic liquid crystal, and liquid crystal molecules are oriented along a surface of the glass substrate and are parallel to each other. The orientation direction continuously twists by 90° between the two glass substrates. Then, a polarizing plate is provided on the upper glass substrate and a polarizing plate is provided on the bottom of the lower glass substrate. Finally, a reflection plate is provided at the structure bottom. In this way, the TN-type liquid crystal display mode is basically present. The ADS relates to advanced super dimension switch technique which utilizes a transverse electric field generated by electrodes located in the same plane to deflect the liquid crystal so as to realize image display.

Embodiment 1

Figure 3:
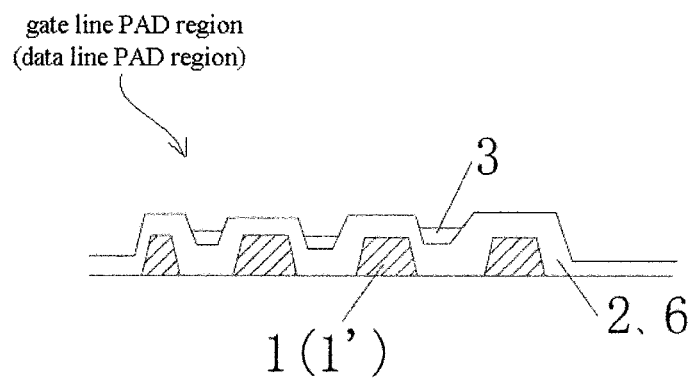
FIG. 3 is a schematic view, in cross-section, showing a structure of the data line PAD region or the gate line PAD region according to Embodiment 1 of the present invention.

As shown in FIG. 3, the present embodiment is based on the TN mode and provides an array substrate. The array substrate comprises a gate line PAD region and a data line PAD region. In the PAD region of the array substrate, gate lines 1 and data lines 1' are formed into the same layer. An insulating layer 2 is formed on the gate lines 1 and the data lines 1', which is same as or conformal to a structure of a display region on the array substrate. Actually, a passivation layer 6 is formed on the insulating layer 2. Gate-line wirings and data-line wirings are formed on the insulating layer 2 and the passivation layer 6, respectively. When observing projections in the horizontal plane, the gate-line wirings are located between adjacent gate lines 1, and the data-line wirings are located between adjacent data lines 1'. Since the cross-sectional views of the gate line PAD region and the data line PAD region are identical with each other, they are simply shown only in FIG. 3.

In order to simplify the manufacturing process of the array substrate and to reduce the number of mask processes, in the present embodiment, the gate-line wirings and the data-line wirings are preferably formed by a transparent conductive film which is located in the same layer as a pixel electrode is located and is made of the same material as that of the pixel electrode. When the pixel electrode is formed, after the deposition of the transparent conductive film is completed, the pixel electrode, the gate-line wirings and the data-line wirings can be formed simply at the same time by one patterning process. Usually, the pixel electrode is made of ITO (Indium Tin Oxide) or IZO (Indium Zinc Oxide). In FIG. 3 corresponding to the present embodiment, the gate-line wirings and the data-line wirings are indicated by ITO wirings 3.

In the present embodiment, a spacing between adjacent gate lines is between 20 μm and 30 μm, and a spacing between adjacent data lines is between 10 μm and 20 μm. Taken into consideration that an error offset specified by technological standards should meet the condition of TP≤3 μm and that a critical size error meets 0.3 μm±0.05 μm, the spacing between adjacent gate lines is provided between 20 μm and 30 μm, so that the spacing is sufficient for forming the ITO wirings 3. Furthermore, the ITO wirings 3 are produced in the form of segments and hence will not cause crosstalk with signals from the gate lines or the data lines. Even if residue of ITO is left and thus the ITO wiring segments are connected with some metal wire, it will not cause adverse influence. When the ITO causes short circuit between two adjacent gate lines, it can be effectively restored during standard test process of the gate lines. Therefore, the technical scheme according to the present embodiment will not influence the yield rate and display effect of the array substrate Embodiment 2

Figure 4:
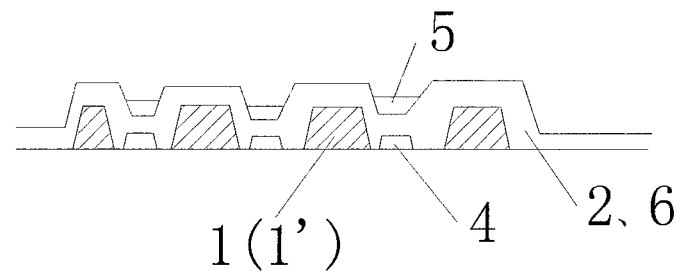
FIG. 4 is a schematic view, in cross-section, showing a structure of the data line PAD region or the gate line PAD region according to Embodiment 2 of the present invention.

With reference to FIG. 4, the array substrate of the present embodiment is set on the basis of ADS mode in which the pixel electrode and a common electrode both are formed on the array substrate, and the common electrode is formed above the pixel electrode or the pixel electrode is formed above the common electrode. In the present embodiment, both of the gate lines and the data lines are formed on a substrate surface, and correspond to a structure of a display region on the array substrate. Gate-line wirings comprise second gate-line wiring segments formed on the insulating layer (specifically including the insulating layer 2 and the passivation layer 6) provided on the gate lines 1, and the second gate-line wiring segments are provided between adjacent gate lines 1 at intervals. Data-line wirings comprise second data-line wiring segments formed on the insulating layer (specifically including the insulating layer 2 and the passivation layer 6) provided on the data lines 1', and the second data-line wiring segments are provided between adjacent data lines 1' at intervals. The gate-line wirings further comprise first gate-line wiring segments which are formed into the same layer as the gate lines 1 are formed into, are provided right under the second gate-line wiring segments and are covered by the insulating layer. That is, the first gate-line wiring segments are located in the same layer as the gate lines 1 are located and are made of the same material as that of the gate lines 1. The data-line wirings further comprise first data-line wiring segments which are formed into the same layer as the data lines 1' are formed into, are provided right under the second data-line wiring segments and are covered by the insulating layer. That is, the first data-line wiring segments are located in the same layer as the data lines 1' are located and are made of the same material as that of the data lines 1'.

In the ADS mode, if the structure of the display region is that the common electrode is provided above the pixel electrode, the first gate-line wiring segments and the first data-line wiring segments are formed by a first transparent conductive film which is located in the same layer as the pixel electrode is located and is made of the same material as that of the pixel electrode, i.e., the first ITO wiring segments 4 shown in FIG. 4. The second gate-line wiring segments and the second data-line wiring segments are formed by a second transparent conductive film which is located in the same layer as the common electrode is located and is made of the same material as that of the common electrode, i.e., the second ITO wiring segments 5 shown in FIG. 4. The second ITO wiring segments 5 are located right above the first ITO wiring segments 4. The ITO wirings may be replaced with IZO wirings.

In the ADS mode, if the structure of the display region is that the pixel electrode is provided above the common electrode, the first gate-line wiring segments and the first data-line wiring segments are formed by a first transparent conductive film which is located in the same layer as the common electrode is located and is made of the same material as that of the common electrode, i.e., the first ITO wiring segments 4 shown in FIG. 4. The second gate-line wiring segments and the second data-line wiring segments are formed by a second transparent conductive film which is located in the same layer as the pixel electrode is located and is made of the same material as that of the pixel electrode, i.e., the second ITO wiring segments 5 shown in FIG. 4. The second ITO wiring segments 5 are located right above the first ITO wiring segments 4. The ITO wirings may be replaced with IZO wirings.

In the PAD region, the spacing between adjacent gate lines and the spacing between adjacent data lines are same as those in Embodiment 1, respectively. In this configuration, with the first ITO wiring segments 4 and the second ITO wiring segments 5, a step can be reduced, so that the ability of resisting scratch at the step can be improved. Moreover, the wirings can be used to restore the scratched gate/data lines, thereby ensuring display quality of the display device.

Embodiment 3

Figure 5:
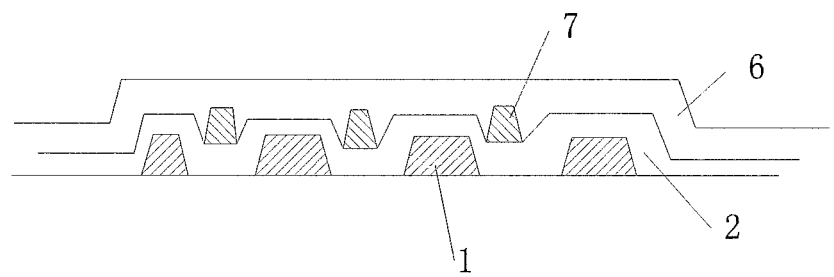
FIGS. 5 and 6 are schematic views, in cross-section, showing a structure of the data line PAD region and the gate line PAD region according to Embodiment 3 of the present invention, respectively.
Figure 6:
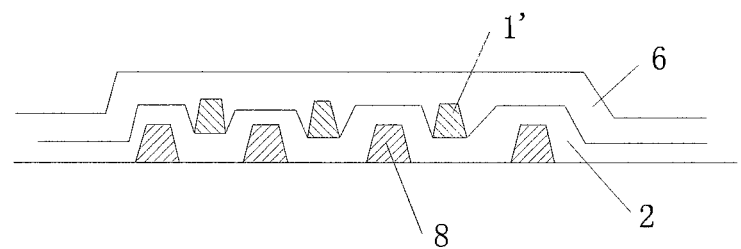

The present embodiment is adapted to the TN mode and the ADS mode. Typically, for configuration of the gate lines and the data lines in the PAD region being located into different layers, the gate lines are provided at the lowest layer, and the data lines are provided above the gate lines. The gate-line wirings are formed by a metal film which is located in the same layer as the data lines are located, and the data-line wirings are formed by a metal film which is located in the same layer as the gate lines are located. As shown in FIGS. 5 and 6, when the gate lines 1 are formed, the data-line wirings 8 necessary for the data lines to be formed are formed while the metal film for the gate lines 1 are formed. The data-line wirings 8 will be located under the data lines 1'. After the gate lines 1 and the data-line wirings 8 are formed, the insulating layer 2 is formed on the gate lines 1 and the data-line wirings 8, and then the data lines 1' and the gate-line wirings 7 are formed on the insulating layer 2. The data lines 1' are located between the formed adjacent data-line wirings 8, and the gate-line wirings 7 are formed between the formed adjacent gate lines. The data-line wirings 8 are formed beside the gate lines 1, or the gate-line wirings 7 are formed beside the data lines 1'. In this way, increased segments (no current) will not cause crosstalk. Furthermore, since the insulating layer is provided between the data lines and the gate lines, there is no risk of short circuit. With the design of the present embodiment, the manufacturing process of the array substrate is simplified, and the step is reduced such that the performance of resisting scratch at the step can be improved. Furthermore, the wiring segments can be used to restore the scratched data lines or gate lines, so that the display quality of the display device can be ensured.

Based on the array substrate provided in the above Embodiments 1-3, the present invention also provides a method of manufacturing the array substrate. Specifically, the method comprises the steps of: in the gate line PAD region of the array substrate, providing the gate-line wirings between adjacent gate lines, wherein the gate-line wirings are parallel to the gate lines and are electrically insulated from the gate lines; in the data line PAD region of the array substrate, providing the data-line wirings between adjacent data lines, wherein the data-line wirings are parallel to the data lines and are electrically insulated from the data lines. Both of the gate-line wirings and the data-line wirings are conductive wiring segments. In an embodiment, the step of providing the gate-line wirings, which are parallel to the gate lines and are electrically insulated from the gate lines, between adjacent gate lines includes forming the gate lines and the insulating layer in the gate line PAD region of the array substrate in this order from bottom to top, and forming the spaced gate-line wirings on the insulating layer, the gate-line wirings being located between adjacent gate lines and being parallel to the gate lines. The step of providing the data-line wirings, which are parallel to the data lines and are electrically insulated from the data lines, between adjacent data lines includes forming the data lines and the insulating layer in the data line PAD region of the array substrate in this order from bottom to top, and forming the spaced data-line wirings on the insulating layer, the data-line wirings being located between adjacent data lines and being parallel to the data lines. Both of the gate-line wirings and the data-line wirings are formed by conductive materials.

Embodiment 4

The present embodiment corresponds to Embodiment 1 and relates to a method of manufacturing the array substrate described in Embodiment 1. The present embodiment focuses on improvement of a manufacturing process of the PAD region. Specifically, the present embodiment comprises the steps of forming the gate lines and the data lines on a substrate, forming the insulating layer and the passivation layer on the gate lines and the data lines in this order from bottom to top, depositing a transparent conductive film on the passivation layer, and forming the pixel electrode in the display region, the gate-line wirings in the gate line PAD region and the data-line wirings in the data line PAD region by a patterning process. The transparent conductive film may be made of ITO or IZO, and the like.

In the present embodiment, the gate-line wirings and the data-line wirings are manufactured by means of formation of the pixel electrode. In this way, one same patterning process can be used to form the pixel electrode and the wirings, and thus the process is simplified, the cost is reduced and manufacture efficiency can be improved.

Embodiment 5

The present embodiment corresponds to Embodiment 2 and relates to a method of manufacturing the array substrate described in Embodiment 2. In a case where the pixel electrode is provided under the common electrode in the display region of the array substrate, the forming process of the PAD region comprises the steps of: forming the gate lines and the data lines on a substrate; depositing a first transparent conductive film on the gate lines and the data lines; forming the first gate-line wiring segments in the gate line PAD region and the first data-line wiring segments in the data line PAD region while forming the pixel electrode in the display region by a patterning process, wherein the first gate-line wiring segments are located between adjacent gate lines, and the first data-line wiring segments are located between adjacent data lines; depositing the insulating layer and the passivation layer on the substrate formed as above described in this order from bottom to top and depositing a second transparent conductive film on the passivation layer; forming the second gate-line wiring segments in the gate line PAD region and the second data-line wiring segments in the data line PAD region while forming the common electrode in the display region by a patterning process, wherein the second gate-line wiring segments are located between adjacent gate lines and the second data-line wiring segments are located between adjacent data lines. The first gate-line wiring segments are located right under the second gate-line wiring segments, and the first data-line wiring segments are located right under the second data-line wiring segments.

In a case where the pixel electrode is provided above the common electrode, the forming process of the PAD region comprises the steps of: forming the gate lines and the data lines on a substrate; depositing a first transparent conductive film on the gate lines and the data lines; forming the first gate-line wiring segments in the gate line PAD region and the first data-line wiring segments in the data line PAD region while forming the common electrode in the display region by a patterning process, wherein the first gate-line wiring segments are located between adjacent gate lines, and the first data-line wiring segments are located between adjacent data lines; depositing the insulating layer and the passivation layer on the substrate formed as above described in this order from bottom to top and depositing a second transparent conductive film on the passivation layer; forming the second gate-line wiring segments in the gate line PAD region and the second data-line wiring segments in the data line PAD region while forming the pixel electrode in the display region by a patterning process, wherein the second gate-line wiring segments are located between adjacent gate lines and the second data-line wiring segments are located between adjacent data lines. The first gate-line wiring segments are located right under the second gate-line wiring segments, and the first data-line wiring segments are located right under the second data-line wiring segments.

In the present embodiments, the gate-line wiring segments and the date-line wiring segments may be formed by ITO or IZO, and the like.

Embodiment 6

The present embodiment corresponds to Embodiment 3 and relates to a method of manufacturing the array substrate described in Embodiment 3. Specifically, the method of manufacturing the PAD region comprises the steps of: depositing a first metal film on a substrate, and forming the gate lines in the display region and the data-line wirings, which will be provided between the data line to be formed, in the data line PAD region by one patterning process; depositing the insulating layer on the first metal film and depositing a second metal film on the insulating layer; forming the data lines in the display region and forming the gate-line wirings provided between the gate lines in the gate line PAD region by a patterning process. The data-line wirings are located between adjacent data lines, and the gate-line wirings are located between adjacent gate lines.

The array substrate manufactured according the present embodiment is adapted to the TN mode and the ADS mode.

Based on the above embodiments, the present invention further provides a display device including the array substrate according to any of the above Embodiments 1-3. The display device according to the present embodiment may be any product or component which provides any display function, such as a liquid crystal panel, an electric paper, a liquid crystal TV, a liquid crystal displayer, a digital picture frame, a mobile phone, a flat computer and the like.

It can be seen from the above embodiments that by forming the gate-line wirings and the data-line wirings in the PAD region, the step can be reduced, so that the ability of resisting scratch at the step can be improved. Furthermore, when metal lines are scratched, the wirings parallel to the metal lines can be used as restoring lines and the scratched lines in the PAD region can be restored by perforation and interconnection achieved by deposition. In this way, the ability of resisting scratch of the product can be improved while not deteriorating performance of display of the product.

The above described embodiments are preferred embodiments of the present invention only. It would be appreciated by those skilled in the art that various changes and substitutions may be made without departing from the principle and spirit of the disclosure. Such changes and substitutions fall into the scope of the disclosure.

What is claimed is:

1. An array substrate, comprising:
   a gate line PAD region and a data line PAD region;
   wherein the gate line PAD region of the array substrate further comprises:
   gate-line wirings, which are parallel to gate lines and are electrically insulated from the gate lines, are formed between adjacent gate lines, and
   wherein the data line PAD region of the array substrate further comprises:
   data-line wirings, which are parallel to the data lines and are electrically insulated from the data lines, are formed between adjacent data lines,
   wherein both the gate-line wirings and the data-line wirings are conductive wiring segments;
   wherein the gate-line wirings are configured to be used as restoring gate lines once the gate lines are scratched, and the data-line wirings are configured to be used as restoring data lines once the data lines are scratched;

wherein the gate-line wirings further include first gate-line wiring segments and second gate-line wiring segments being formed between adjacent gate lines, wherein, the first gate-line wiring segments are formed in a same layer as the gate lines are formed, the second gate-line wiring segments are formed above an insulating layer provided on the gate lines; and the first gate-line wiring segments are formed directly under the second gate-line wiring segments and are covered by the insulating layer; and wherein the data-line wirings further include first data-line wiring segments and second data-line wiring segments being formed between adjacent data lines, wherein, the first data-tine wiring segments are formed in a same layer as the data lines are formed, the second data-line wiring segments are formed above the insulating layer provided on the data lines; and the first data-line wiring segments are formed directly under the second data-line wiring segments and are covered by the insulating layer.

2. The array substrate according to claim 1, wherein the array substrate further comprises a common electrode and a pixel electrode in a display region of the array substrate;

wherein the pixel electrode is formed above the common electrode, the second gate-line wiring segments and the second data-line wiring segments are formed in a same layer as the pixel electrode is formed and are formed of a same material as the pixel electrode, wherein the first gate-line wiring segments and the first data-line wiring segments are formed in a same layer as the common electrode is formed and are formed of a same material as the common electrode; or wherein the pixel electrode is formed under the common electrode, the second gate-line wiring segments and the second data-line wiring segments are formed in a same layer as the common electrode is formed and are formed of a same material as the common electrode, wherein the first gate-line wiring segments and the first data-line wiring segments are formed in a same layer as the pixel electrode is formed and are formed of same material as the pixel electrode.

3. The array substrate according to claim 1, wherein a spacing between adjacent gate lines is between 20 μm and 30 μm, and a spacing between adjacent data lines is between 10 μm and 20 μm.

4. A method of manufacturing an array substrate, comprising the steps of:

in a gate line PAD region of the array substrate, forming gate-line wirings between adjacent gate lines, wherein the gate-line wirings are parallel to the adjacent gate lines and are electrically insulated from the adjacent gate lines; and in a data line PAD region of the array substrate, forming data-line wirings between adjacent data lines, wherein the data-line wirings are parallel to the adjacent data lines and are electrically insulated from the adjacent data lines, wherein both the gate-line wirings and the data-line wirings are conductive wiring segments;

wherein the gate-line wirings are configured to be used as restoring gate lines once gate lines of adjacent gate lines are scratched, and the data-line wirings are configured to be used as restoring data lines once the data lines of the adjacent data lines are scratched;

wherein the step of forming gate-line wirings between adjacent gate lines, wherein the gate-line wirings are parallel to the adjacent gate lines and are electrically insulated from the adjacent gate lines; and the step of forming the data-line wirings between adjacent data lines, wherein the data-line wirings are parallel to the adjacent data lines and are electrically insulated from the adjacent data lines, are performed in parallel and include;

depositing a first metal film on a substrate, and forming the data-line wirings spaced apart from each other, in the data line PAD region while forming the adjacent gate lines by a patterning process;

depositing an insulating layer on the first metal film and depositing a second metal film on the insulating layer; forming the gate-line wiring provided between the adjacent gate lines in the gate line PAD region while forming the adjacent data lines by a patterning process;

wherein the data-line wirings are formed between adjacent data lines, and the gate-line wirings are forming between adjacent gate lines.

5. A method of manufacturing an array substrate, comprising the steps of:

in a gate line PAD region of the array substrate, forming gate-line wirings between adjacent gate lines, wherein the gate-line wirings are parallel to the adjacent gate lines and are electrically insulated from the adjacent gate lines; and in a data line PAD region of the array substrate, forming data-line wirings between adjacent data lines, wherein the data-line wirings are parallel to the adjacent data lines and are electrically insulated from the adjacent data lines, wherein both the gate-line wirings and the data-line wirings are conductive wiring segments;

wherein the gate-line wirings are configured to be used as restoring gate lines once gate lines of adjacent gate lines are scratched, and the data-line wirings are configured to be used as restoring data lines once the data lines of the adjacent data lines are scratched; wherein the step of forming gate-line wirings between adjacent gate lines, wherein the gate-line wirings are parallel to the adjacent gate lines and are electrically insulated from the adjacent gate lines and the step of forming data-line wirings between adjacent data lines, wherein the data-line wirings are parallel to the adjacent data lines and are electrically insulated from the adjacent data lines, are performed in parallel and include:

depositing a first transparent conductive film on gate lines and data lines; forming first gate-line wiring segments in the gate line PAD region and first data-line wiring segments in the data line PAD region while forming a pixel electrode in a display region by a patterning process, wherein the first gate-line wiring segments are formed between adjacent gate lines, and the first data-line wiring segments are formed between adjacent data lines;

forming an insulating layer and a passivation layer on the array substrate in sequence from bottom to top and depositing a second transparent conductive film on the passivation layer; forming second gate-line wiring segments in the gate line PAD region and second data-line wiring segments in the data line PAD region while forming a common electrode in the display region by a patterning process, wherein the second gate-line wiring segments are formed between adjacent gate lines and the second data-line wiring segments are formed between adjacent data lines;

wherein the first gate-line wiring segments are formed directly under the second gate-line wiring segments, and the first data-line wiring segments are formed directly under the second data-line wiring segments.

6. A method of manufacturing an array substrate, comprising the steps of:
in a gate line PAD region of the array substrate,
forming gate-line wirings between adjacent gate lines, wherein the gate-line wirings are parallel to the adjacent gate lines and are electrically insulated from the adjacent gate lines; and
in a data line PAD region of the array substrate,
forming data-line wirings between adjacent data lines, wherein the data-line wirings are parallel to the adjacent data lines and are electrically insulated from the adjacent data lines, wherein both the gate-line wirings and the data-line wirings are conductive wiring segments;
wherein the gate-line wirings are configured to be used as restoring gate lines once gate lines of adjacent gate lines are scratched, and
the data-line wirings are configured to be used as restoring data lines once the data lines of the adjacent data lines are scratched; wherein the step of forming gate-line wirings between adjacent gate lines, wherein the gate-line wirings are parallel to the adjacent gate lines and are electrically insulated from the adjacent gate lines; and the step of forming the data-line wirings between adjacent data lines, wherein the data-line wirings are parallel to the adjacent data lines and are electrically insulated from the adjacent data lines, are performed in parallel and include:
depositing a first transparent conductive film on gate lines and data lines; forming first gate-line wiring segments in the gate line PAD region and first data-line wiring segments in the data line PAD region while forming a common electrode in a display region by a patterning process, wherein the first gate-line wiring segments are formed between adjacent gate lines, and the first data-line wiring segments are formed between adjacent data lines;
forming an insulating layer and a passivation layer on the array substrate in sequence from bottom to top and depositing a second transparent conductive film on the passivation layer; forming second gate-line wiring segments in the gate line PAD region and second data-line wiring segments in the data line PAD region while forming a pixel electrode in the display region by a patterning process, wherein the second gate-line wiring segments are formed between adjacent gate lines and the second data-line wiring segments are formed between adjacent data lines;
wherein the first gate-line wiring segments are formed directly under the second gate-line wiring segments, and the first data-line wiring segments are formed directly under the second data-line wiring segments.

7. A display device, including the array substrate according to claim 1.

8. The display device according to claim 7, wherein the array substrate further comprises a common electrode and a pixel electrode,
wherein the pixel electrode is formed above the common electrode, the second gate-line wiring segments and the second data-line wiring segments are formed in a same layer as the pixel electrode is formed and are formed by a same material as the pixel electrode, wherein the first gate-line wiring segments and the first data-line wiring segments are formed in a same layer as the common electrode is formed and are formed of a same material as the common electrode; or
wherein the pixel electrode is formed under the common electrode, the second gate-line wiring segments and the second data-line wiring segments are formed in a same layer as the common electrode is formed and are formed of a same material as the common electrode, wherein the first gate-line wiring segments and the first data-line wiring segments are formed in a same layer as the pixel electrode is formed and are formed of a same material as the pixel electrode.

9. The display device according to claim 7, wherein a spacing between adjacent gate lines is between 20 μm and 30 μm, and a spacing between adjacent data lines is between 10 μm and 20 μm.

10. An array substrate, comprising:
a gate line PAD region and a data line PAD region;
wherein the gate line PAD region of the array substrate further comprises:
gate-line wirings, which are parallel to gate lines and are electrically insulated from the gate lines, are formed between adjacent gate lines, and
wherein the data line PAD region of the array substrate further comprises:
data-line wirings, which are parallel to the data lines and are electrically insulated from the data lines, are formed between adjacent data lines,
wherein both the gate-line wirings and the data-line wirings are conductive wiring segments;
wherein the gate-line wirings are configured to be used as restoring gate lines once the gate lines are scratched, and the data-line wirings are configured to be used as restoring data lines once the data lines are scratched;
wherein the gate-line wirings include gate-line wiring segments formed on an insulating layer formed on the gate lines, the gate-line wiring segments are formed between adjacent gate lines;
wherein the data-line wirings include data-line wiring segments formed underneath a first portion of the insulating layer formed underneath the data lines, the data-line wiring segments are formed between adjacent data lines; and
wherein a second portion of the insulating layer covers the gate-line wiring segments and the data lines, and the gate lines and the data lines are formed in different layers.

11. The array substrate according to claim 10, wherein the gate-line wiring segments are formed in a same layer as the data line are formed and are formed of a same material as the data lines; and wherein the data-line wiring segments are formed in a same layer as the gate lines are formed and are formed of a same material as the gate lines.

12. The array substrate according to claim 10, wherein a spacing between adjacent gate lines is between 20 μm and 30 μm, and a spacing between adjacent data lines is between 10 μm and 20 μm.

13. A display device, including the array substrate according to claim 10.

14. The display device according to claim 13, wherein the gate-line wiring segments are formed in a same layer as the data line are formed and are formed of a same material as the data lines; and wherein the data-line wiring segments are formed in a same layer as the gate lines are formed and are formed of a same material as the gate lines.

15. The display device according to claim 13, wherein a spacing between adjacent gate lines is between 20 μm and 30 μm, and a spacing between adjacent data lines is between 10 μm and 20 μm.

* * * * *